United States Patent [19]

Falk

[11] Patent Number: 5,550,485

[45] Date of Patent: Aug. 27, 1996

[54] MULTIFUNCTION ALTERNATOR TESTING DEVICE

[76] Inventor: Dean A. Falk, 1122 Buena Vista Ave., Waukesha, Wis. 53188

[21] Appl. No.: 378,910

[22] Filed: Jan. 26, 1995

Related U.S. Application Data

[63] Continuation of Ser. No. 71,841, Jun. 4, 1993, abandoned.

[51] Int. Cl.⁶ .................................................. G01R 31/00
[52] U.S. Cl. ............................................. 324/772; 322/99
[58] Field of Search .............................. 324/772, 767, 324/158.1; 322/99

[56] References Cited

U.S. PATENT DOCUMENTS

| | | | |
|---|---|---|---|
| 836,359 | 7/1904 | Behrend | 322/99 |
| 4,070,624 | 1/1978 | Taylor | 324/158 MG |
| 4,348,629 | 9/1982 | Sievers | 322/99 |
| 4,613,808 | 9/1986 | Edwards | 322/99 |

Primary Examiner—Kenneth A. Wieder
Assistant Examiner—Mark Wardas
Attorney, Agent, or Firm—Whyte Hirshchboeck Dudek S.C.

[57] ABSTRACT

An alternator testing device has a frame to which is secured an adjustable bracket for mounting an alternator. A housing, which is also secured to the frame includes a control panel and a testing circuit. The control panel permits the operator to configure the circuit to perform a series of tests to determine whether the alternator is functioning properly. These tests are conducted in a manner which replicates the operation of the alternator in a motor vehicle, rather than in a simulation.

17 Claims, 6 Drawing Sheets

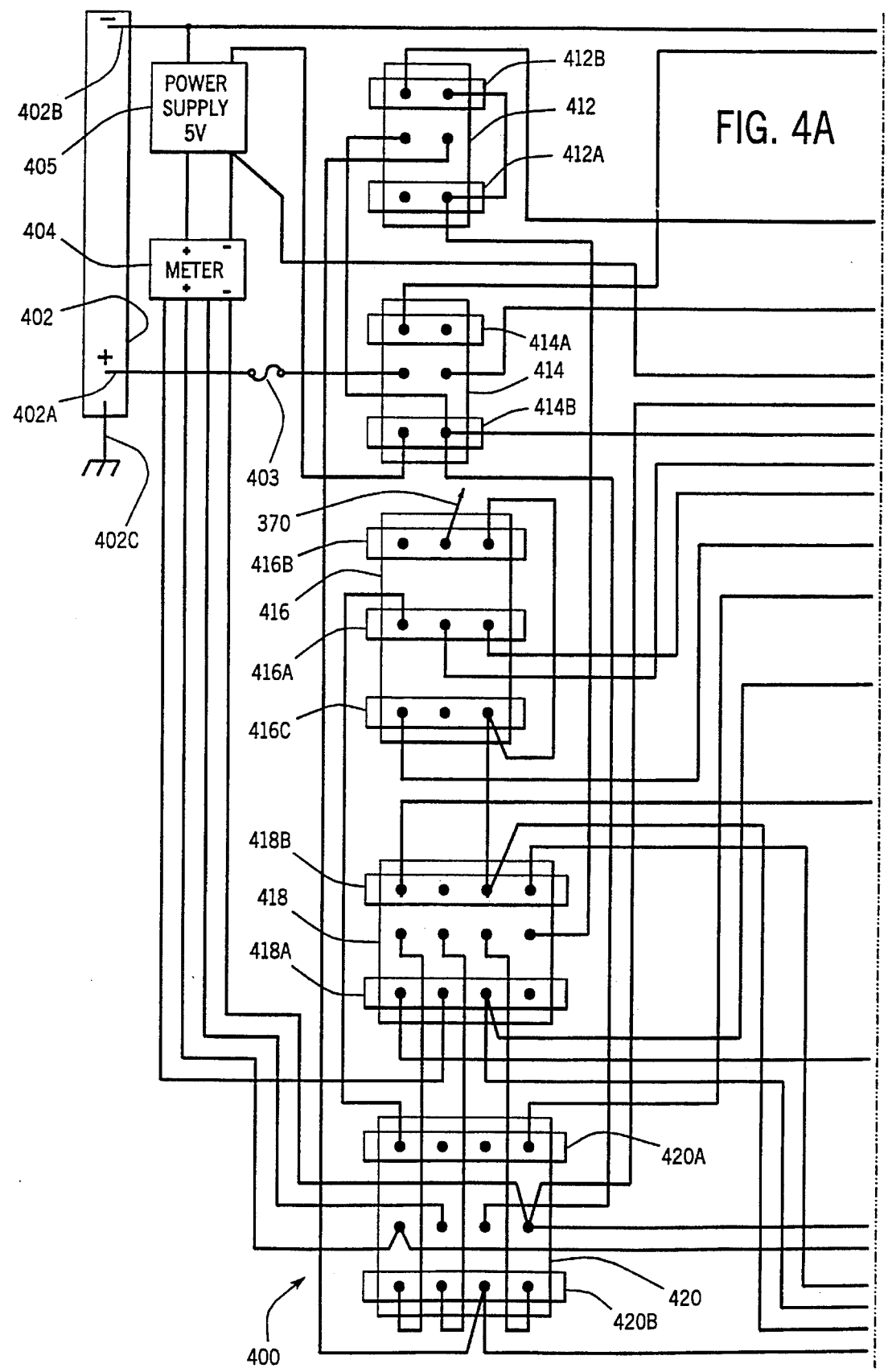

MULTIFUNCTION ALTERNATOR TESTING DEVICE

This is a continuation of application Ser. No. 08/071,841 filed on Jun. 4, 1993, now abandoned.

BACKGROUND OF THE INVENTION

1. Field of the Invention

The present invention relates generally to devices for analyzing truck or automotive type alternators to evaluate whether the alternators are in proper working condition. More specifically, the present invention relates to an alternator testing device which tests the alternator in actual use conditions and evaluates the alternator for proper maximum amperage output, proper charging voltage, diode and stator integrity, reverse leakage of current from the vehicle battery and general mechanical condition.

2. Description of Related Art

Earlier alternator testing devices have suffered from several shortcomings. In a number of earlier devices, the alternator was tested in a simulation of the actual operating conditions of a motor vehicle. The alternator was subjected to less than full load operation, thereby yielding results which could be construed incorrectly to show proper operation of the alternator unit. A number of earlier systems also suffer from the shortcoming that they were only able to test some aspects of alternator operation, rather than a full evaluation of the alternator's operating characteristics to determine whether the alternator was in proper working condition.

In addition, earlier testing devices which were more reliable tended to be complicated to operate. A high level of skill was needed by the operator in order to operate and properly diagnose any problems with an alternator. Such devices were also prohibitively expensive to purchase and maintain.

The need for an efficient and complete operational evaluation of an alternator is important since the alternators used in many vehicles are expensive components. If a recently purchased alternator is thought to be inoperable, it frequently will be sent back to the manufacturer or a remanufacturer, via several lines of distribution. This is extremely costly if the alternator is actually operating properly, because of the labor, handling, paperwork and final evaluation test required. In addition, the owner of the motor vehicle or its operator would have to purchase a new alternator at a substantial cost. If the alternator is diagnosed as functioning properly, this also directs the technician to a different part of the vehicle for repair. The purchase of an alternator, in many cases, has been unnecessary and therefore created undue expense for the motor vehicle owner or operator. Moreover, replacement of a properly operating alternator did not solve the original electrical system problem.

The present invention allows an operator to confirm whether an alternator is good or bad, by providing a reliable method of diagnosis that eliminates the guesswork frequently associated with troubleshooting the charging systems of internal combustion engines. These charging systems, and alternators in particular, are notorious for being difficult to diagnose accurately. The present invention accomplishes this using a relatively inexpensive apparatus which can be operated by an individual without training in the electrical arts.

The present invention also reduces the cost of warranties. Thirty to fifty percent of all alternators returned function properly, but are returned due to poor diagnosis, poor test equipment, or incorrect guessing by the service technician in the absence of affordable test equipment. As noted above, the costs associated with returned units that are functioning properly are astronomical.

A device which would overcome the shortcomings of earlier devices and reduce the costs associated with testing equipment and properly functioning alternators which are returned mistakenly would represent a significant advancement in the art.

OBJECTS AND SUMMARY OF THE INVENTION

It is a principal object of the present invention to provide an alternator testing device which tests a motor vehicle alternator under actual use conditions for maximum amperage output, correct charging voltage, diode and stator imbalance and reverse leakage problems from the vehicle battery.

It is another object of the present invention to provide an alternator testing device which provides easy operation by a person testing the alternator so that testing can be accomplished in a relatively short period of time by the motor vehicle operator or a sales clerk.

It is yet another object of the present invention to provide an alternator testing device which is a self-contained, free-standing unit, which can operate on standard household electrical service.

How these and other objects of the present invention are accomplished will be described in a detailed description of the preferred embodiment in connection with the figures. Generally, however, the objects are accomplished in an alternator testing device having a frame to which is mounted a bracket for mounting an alternator. A housing, which is also secured to the frame includes a control panel and a testing circuit. The control panel permits the operator to configure the circuit to perform a series of tests to determine whether the alternator is functioning properly. These tests are conducted in a manner which replicates the operation of the alternator in a motor vehicle, rather than in a simulation.

Other variations, modifications and applications of the invention will become apparent to those presently of ordinary skill in the art after reading the specification and are deemed to fall within the scope of the present invention if they fall within the scope of the claims which follow the description of the preferred embodiment.

DESCRIPTION OF THE DRAWINGS

FIGS. 4A–C is a schematic diagram of the testing circuit of the present invention.

In the FIGURES, like reference numerals refer to like components.

DETAILED DESCRIPTION OF THE PREFERRED EMBODIMENT

Figure 1:
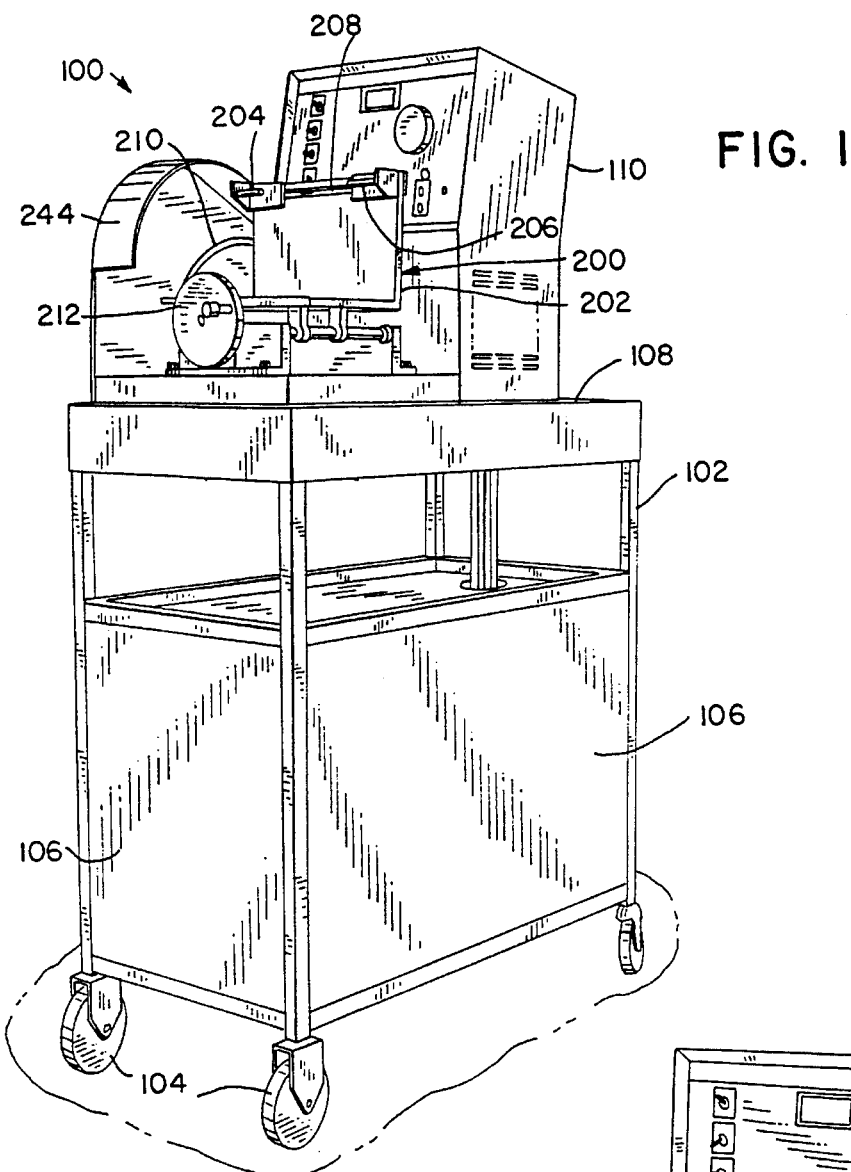
FIG. 1 is a prospective view of the present invention. A motor vehicle alternator is mounted to the mounting bracket and the device is connected for testing of the alternator.

The preferred embodiment of the present invention is shown in the FIGURES. Generally, as seen in FIG. 1, the present invention is an alternator testing device 100 includes a supporting bracket 102 having wheels 104 of conventional design and mounting. The lower portion of supporting bracket 102 has four walls 106 which define a lower cabinet unit which will be described in ore detail below.

Figure 2A:
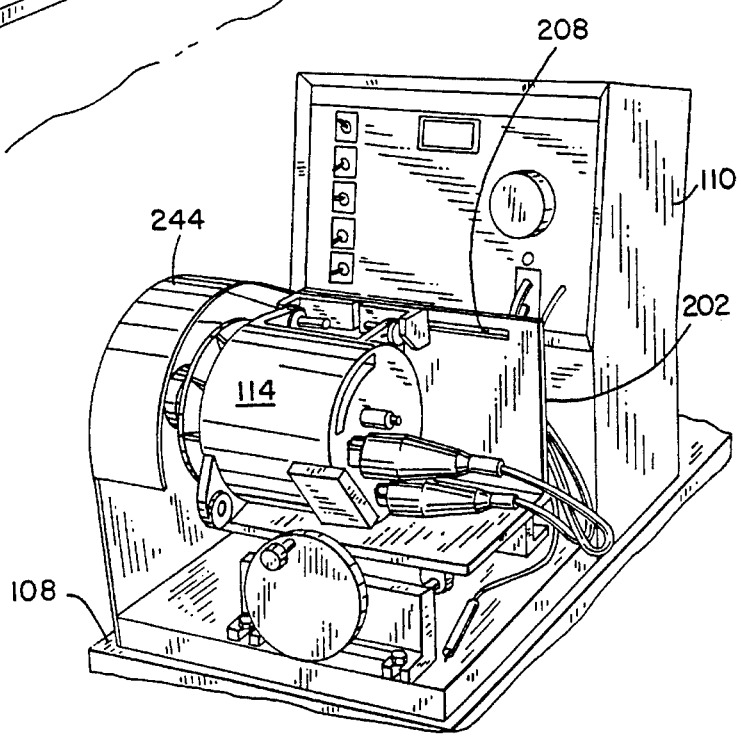
FIG. 2A is a prospective view of the present invention with a motor vehicle alternator mounted the device for testing of the alternator.
Figure 2B:
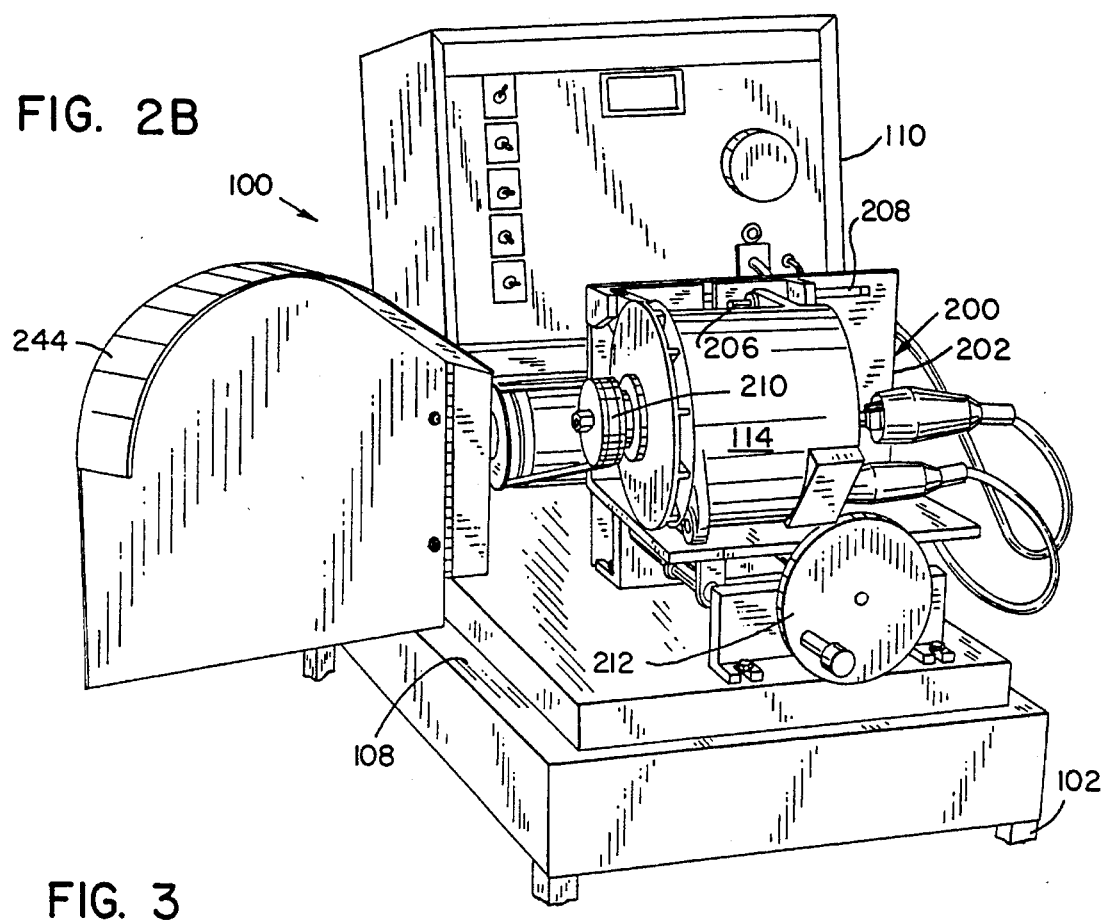
FIG. 2B is a prospective view of the present invention with a motor vehicle alternator mounted the device for testing of the alternator and with the belt guard in an open position.

The upper section of bracket 102 has a platform 108 on which is mounted a housing 110 and mounting bracket 200. In FIG. 2A, an alternator 114 is secured to bracket 200 in manner to be described in more detail below. Housing 110 contains a control and testing circuit, which will be described in more detail below. Housing 110 also has a face plate which will be described in more detail below.

Mounting Bracket

The mounting bracket 200 of the present invention is shown in FIGS. 1 and 2A. FIG. 1 shows bracket 200 without an alternator secured to it. Bracket 200 includes an L-shaped brace 202 having two planar surfaces at a right angle to one another. Brace 202 also has a pair of pins 204, 206. Pin 204 and pin 206 are free to slide in slot 208 on brace 202. An alternator 114 has two hinge holes. The first hinge hole is engaged by pin 204. Pin 206 then slides to engage the other alternator hinge hole, thus securing the alternator 114 to the brace 202.

The alternator 114 is held firmly against brace 202 by the belt 210 of the device 100. Belt 210 is run by the motor of the device 100, which will be explained in more detail below. The belt 210 is adjusted using crank 212. In the preferred embodiment, crank 212 is connected to a linear actuator of conventional design (not shown in detail). Brace 202 may be moved closer to or further from the housing 110 by turning the crank 212 in the appropriate direction. As will be explained in more detail below, movement of the brace 202 is necessary to provide proper tension between the motor of the device 100 and the alternator 114 being tested.

A belt guard 244 is connected to housing 110 by a hinge 216 of conventional design. In its closed position, belt guard 244 encloses a substantial portion of the belt 210 and its connection to the alternator 114. In its open position, belt guard 244 permits access to the belt 210 and its connection to the alternator 114, thus allowing the operator of the device 100 to adjust the tensioning of the belt 210.

Control Panel

Figure 3:
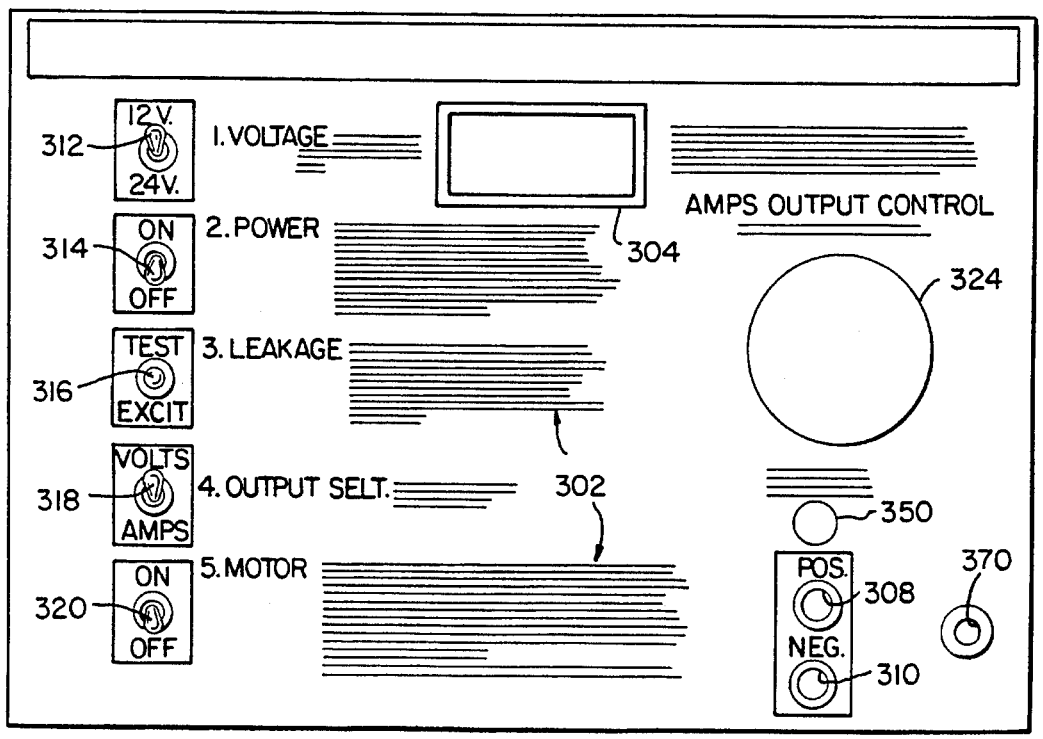
FIG. 3 is a front plan view of the face plate of the present invention showing the switches and connection leads used for conducting various tests on an alternator.
Figure 2C:
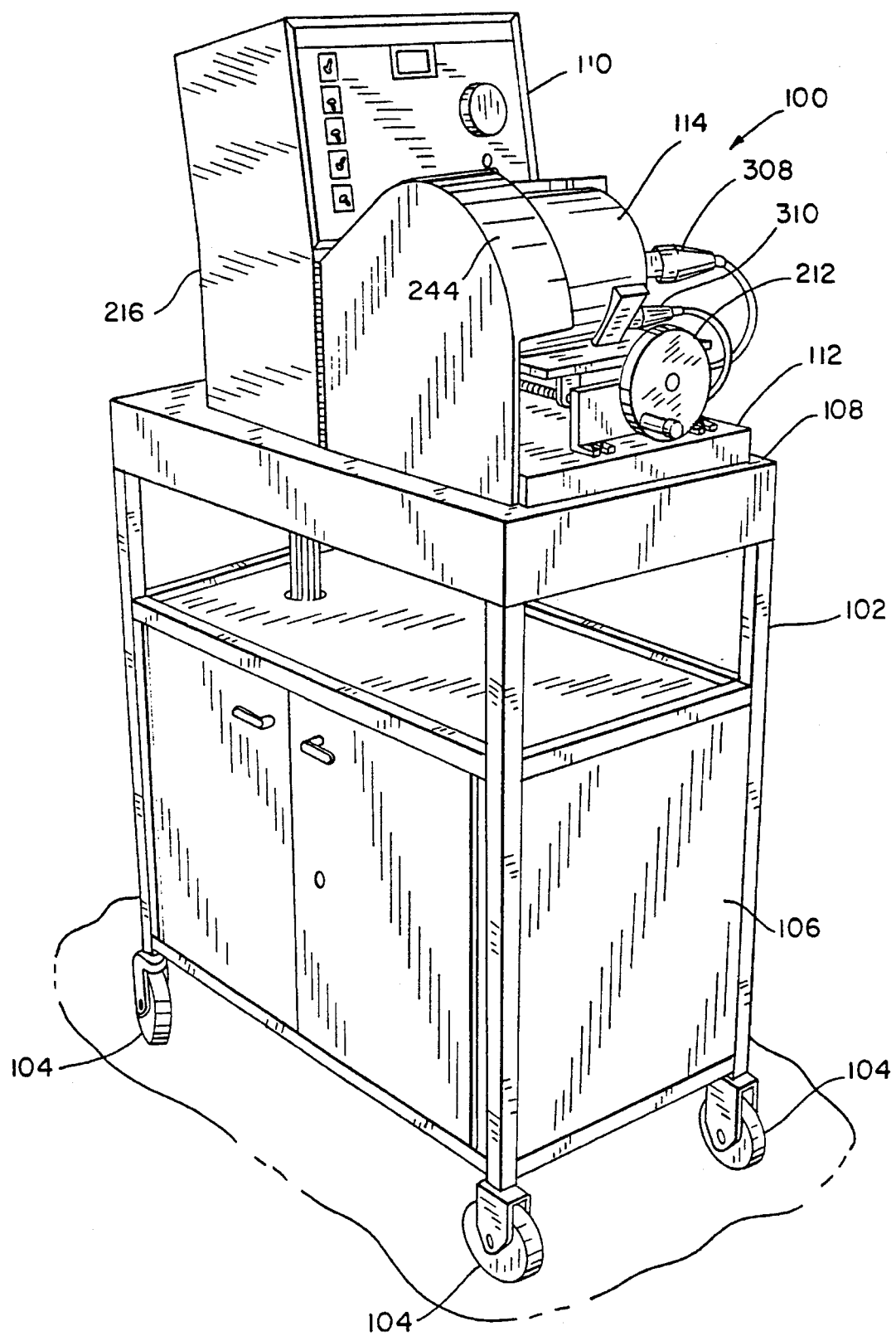
FIG. 2C is another prospective view of the present invention with a motor vehicle alternator mounted the device for testing of the alternator.

The control panel 300 of the preferred embodiment of the device 100 is shown in FIG. 3. Generally, the control panel 300 is used to select and perform the various tests available with the present invention. In the preferred embodiment, the control panel includes instructions 302 for the operator. Panel 300 also has a digital display 304, a DIODE-STATOR FAILURE light 350, a positive lead 308, a negative lead 310 and an excitation lead 370. Finally, a series of five toggle switches 312, 314, 316, 318, 320 and an AMPS OUTPUT CONTROL dial 324 are also located on the panel.

Switches 312, 314, 318, 320 are two position toggle switches and will be explained in more detail below. Switch 316 normally is in its center OFF position. Dial 324 may be rotated clockwise and counterclockwise to assist in testing an alternator, and will be explained in more detail below.

Leads 308, 310 have alligator type clips at their ends, while lead 370 is a test probe. Leads 308, 310, 370 are used to connect an alternator to the device 100 for testing. The leads may also be used to excite an alternator if it has lost its residual magnetism. Use of panel 300 will be explained below in connection with the testing circuit of FIGS. 4A–C.

Testing Circuit

Figure 4B:
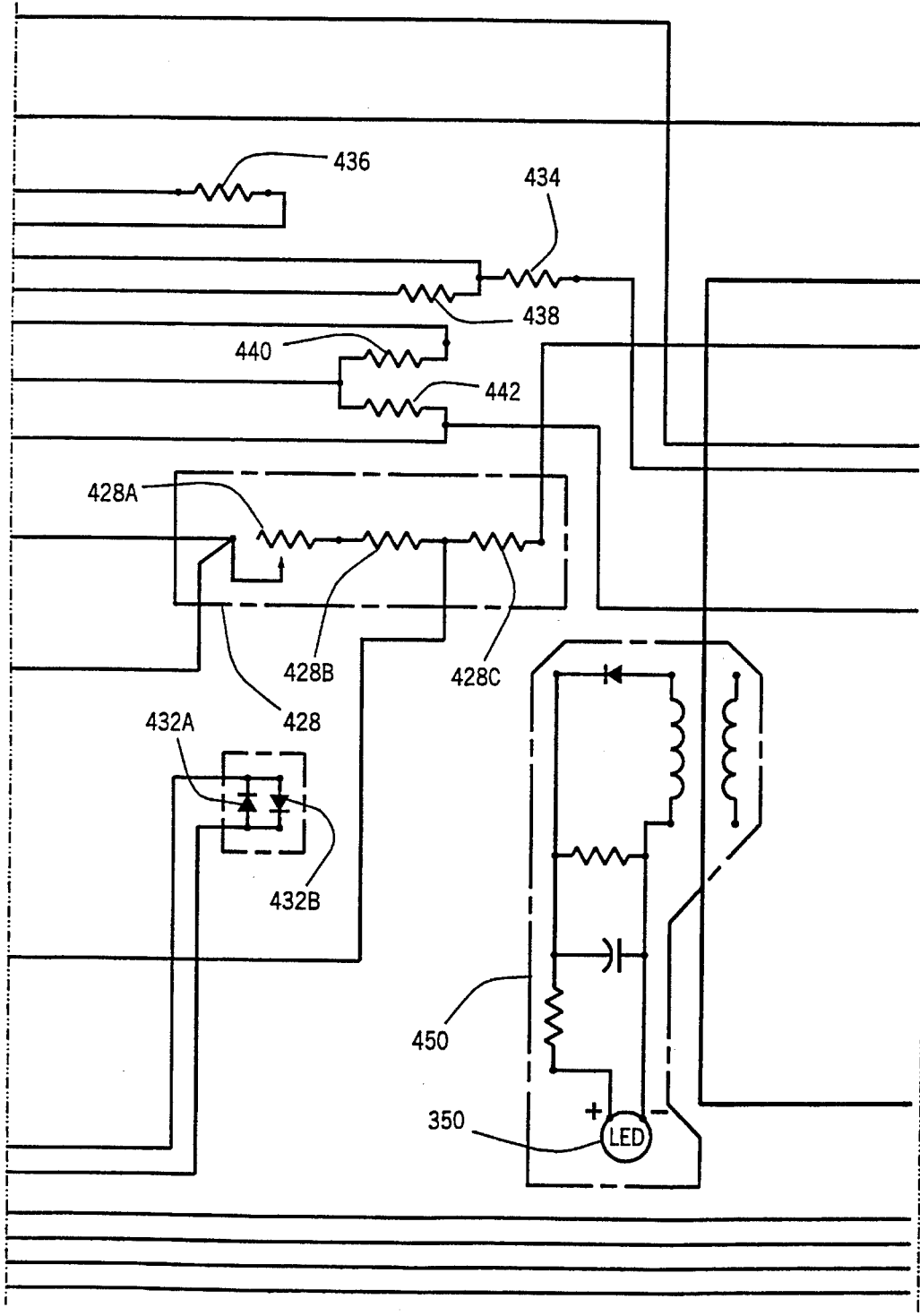
Figure 4C:
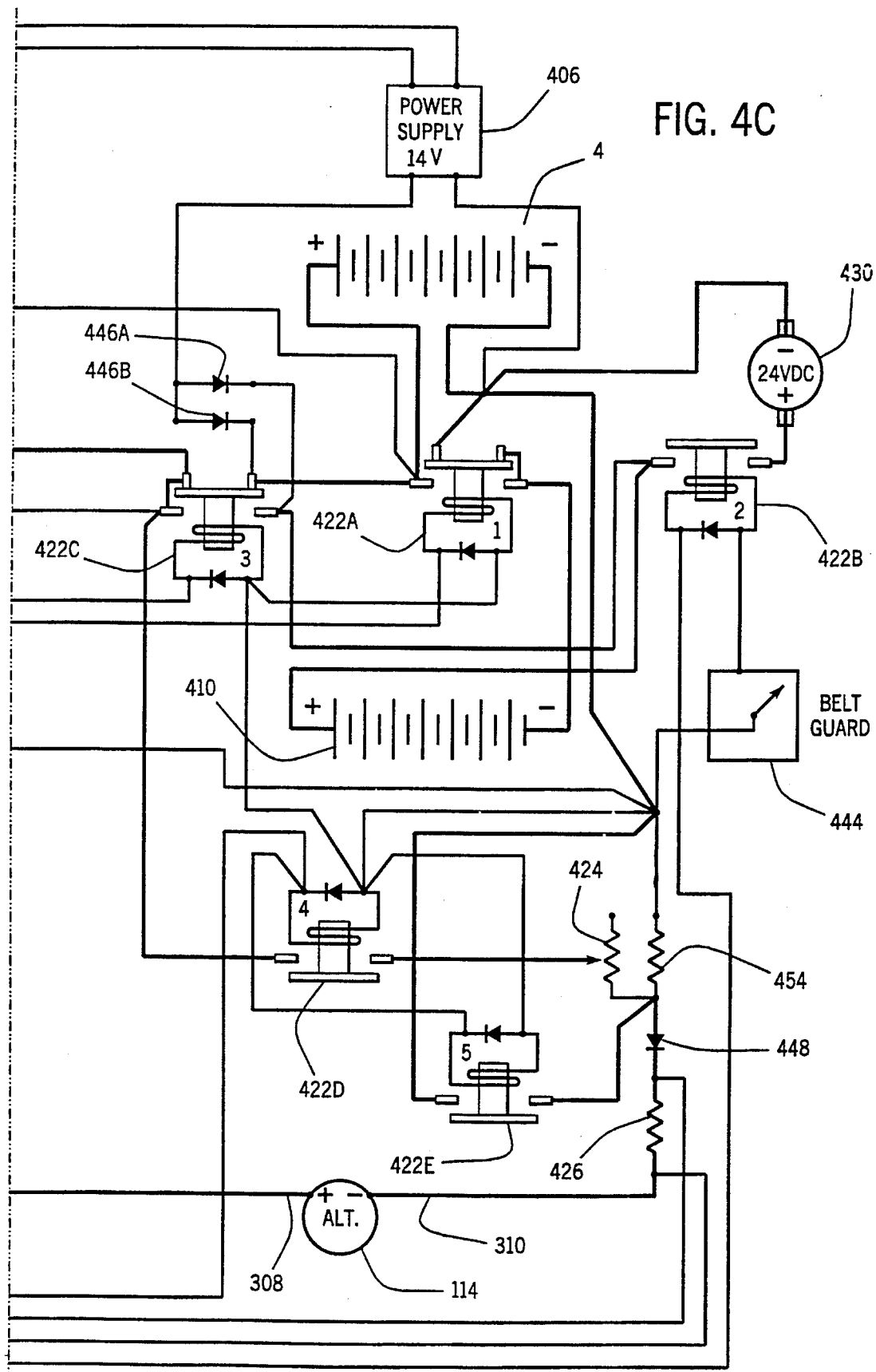

The testing circuit of the present invention is shown in detail in FIGS. 4A–C. Circuit 400 has an inlet power cord 402 having a hot line 402A with a fuse 403, a neutral line 402B, and a ground 402C in the preferred embodiment. Power cord 402 supplies electricity to a 5 volt power supply 405 and a 14 volt power supply 406. Power supply 405 is connected to a meter 404 (in the preferred embodiment, a voltmeter operating on a range of 0–200 mV). Meter 404 supplies display 304 with a number representing the number of millivolts sensed by the meter 404. Power supply 406 has a first battery 408 and a second battery 410 connected to it, as seen in FIGS. 4A–C. Diodes 446A and 446B are connected between power supply 406 and batteries 408, 410 to ensure even automatic charging when switch 314 is in its OFF position.

Batteries 408, 410 allow the 8 horsepower DC motor 430, described in more detail below, to operate without the need for 220 VAC or 3 Phase electric service, as would normally be the case. Instead, device 100 can operate on standard household current, thereby allowing testing of alternators in a variety of locations.

In the preferred embodiment, circuit 400 includes a plurality of switches 412, 414, 416, 418, 420 and solenoid switches 422A–E used to configure circuit 400 to perform various tests on an alternator. Operation of switches 422A–E will not be described in detail since selection and sequencing of these switches to provide the desired operational characteristics of the circuit 400 is a matter of design choice. It should be noted, however, that the arrangement of solenoid switches 422A–E shown in FIGS. 4A–C allows circuit 400 to perform a number of tests on an alternator with minimal switching.

Switch 412 may be set to a first position 412A to configure circuit 400 to test alternators designed to supply power to vehicles utilizing a 12 volt battery, or to a second position 412B to configure circuit 400 to test alternators designed to supply power to vehicles utilizing a 24 volt battery. An alternator typically indicates on its name plate whether it is a 12 volt type or a 24 volt type. The different positions of switch 412 provide different configurations of the batteries 408 and 410.

When switch 412 is moved to its 12 V position 412A, 12 volts are applied to the alternator 114 (from battery 408) and 24 volts are applied to a DC motor 430 (from combined batteries 408, 410). When switch 412 is moved to its 24 V position 412B, 24 volts are applied to the alternator 114 and 24 volts are applied to motor 430 (by batteries 408, 410 in series).

Switch 414 controls the power supplies 405 and 406 of the circuit 400. When switch 414 is set to position 414A, the 5 volt power supply 405 is turned off, while power supply 406 is turned on, thereby recharging the batteries 408, 410. When switch 414 is set to position 414B, the 5 volt power supply is turned on (and thus the display 304 of meter 404 is on), and the 14 volt power supply 406 is turned off, allowing batteries 408, 410 to supply voltage and current independently (in the same manner that a vehicle battery supplies current and voltage to the vehicle).

Switch 416 permits two different functions to be performed by the device 100. Normally, switch 416 is in a center position 416A. In the event that the alternator 114 has lost its residual magnetism, the excitation lead 370 may be connected to the alternator 114 at its excitation terminal. If switch 416 is then moved from its center position 416A to the EXCITATION position 416B, shown in FIGS. 4A–C, magnetism is induced in the alternator 114, providing it with sufficient magnetism in its iron core to permit normal operation (and testing) of the alternator. In addition, excitation is induced by applying power to the output terminals of the alternator.

When switch 416 is moved from its center position 416A to the TEST position 416C, the batteries 408, 410 are connected to the alternator 114 to test whether current is flowing from the batteries 408, 410 to the alternator 114 at an unacceptable level (typically, more than 100 mA is unacceptable). This leakage current is measured across a shunt resistor 442. The resistance of shunt 442 is selected so that a leak of 100 mA is shown as "100" on the display 304 of meter 404.

Switch 418 has a VOLTS setting 418A and an AMPS setting 418B. A voltage divider 428 has an adjustable resistor 428A, a low resistance resistor 428B, and a high resistance resistor 428C. When switch 418 is set to position 418A, meter 404 measures the voltage from the voltage divider 428. Voltage divider 428 measures the voltage across the alternator 114. Divider 428 is used to condition the voltage reading across the alternator 114 so that it can be measured by meter 404 without damage to meter 404.

When switch 418 is set to its AMPS position 418B, the meter 404 is connected to read the voltage drop across a shunt 426. Resistance for shunt 426 is selected so that the millivolt drop across the shunt 426 is the same numerical value as the number of amps flowing through the shunt 426.

Switch 420 selectively turns on DC motor 430 which is connected to the batteries 408, 410, the solenoid switches 422, and the alternator 114. Normally, switch 420 is in its OFF position 420A and motor 430 is not operating. When switch 420 is moved to its ON position 420B, 24 V is applied to the motor 430 and it begins to operate the alternator 114.

Circuit 400 also has several other features. Two reversely parallel diodes 432A, 432B are connected to prevent large voltage spikes from the motor 430 from damaging the meter 404. Since a motor like motor 430 can produce voltage spikes of several hundred volts, diodes 432 limit the voltage to meter 404 to 0.7 V. A dropping resistor 434 reduces the voltage to solenoid switch 422A to prevent overheating of that switch. Meter 404 uses a stabilization resistor 436.

A current limiting resistor 438 limits excitation current to a useful and safe level. Similarly, resistors 440 and 442 limit the second excitation current to a useful and safe level. The combination of resistors 440 and 442 is also used to limit current during the reverse current leakage test. A microswitch 444 prevents solenoid switch 422B from supplying power to the motor 430 if the belt guard 244 is not closed.

Operation

Generally, operation of the device 100 is provided by the instructions on panel 300. By manipulating switches 312, 314, 316, 318, 320 and dial 324, the operator may test for reverse current leakage, alternator output voltage, and amperage output. Additionally, the condition and balance of the alternator diodes and stator are indicated by a light-emitting diode 306.

Initially, the operator selects the voltage for the alternator being tested using toggle switch 312 which, in turn, configures circuit 400 via switch 412 to test for a 24 volt alternator or a 12 volt alternator. The power switch 314 is then switched to ON, moving switch 414 to position 414B. As noted above, turning switch 314 to its ON position turns off the 14 volt power supply 406 and turns on the 5 volt power supply 405.

At this time, the operator may recheck the tension of belt 210. The operator then connects the red positive lead 308 to the positive terminal of the alternator 114 and the black negative lead 310 to the negative terminal of the alternator 114. Dial 324 is turned completely to its extreme clockwise position and then one-eighth of a turn to the counterclockwise direction. The operator may again check to make sure that the alternator 114 is securely mounted to the bracket 200 using pins 204, 206 and belt 210.

If the alternator being tested has been stored for an exceedingly long period of time and lacks enough residual magnetism, or if the alternator has been disassembled at some point (causing loss of residual magnetism), the operator may turn switch 316 to the EXCITATION position which moves switch 416 to position 416B. The alternator is remagnetized in two ways. First, the excitation lead 370, which would be connected to the energizing terminal of the alternator 114, energizes the internal electromagnets. Additionally, current is fed to the negative terminal of the alternator via conditioning resistors 440 and 442 to provide additional magnetization of the alternator.

In the preferred embodiment, the first test to be performed is for reverse current leakage. Switch 316 is moved to the TEST position, thereby moving switch 416 of circuit 400 into position 416C. If there is any reverse current leakage between the batteries 408, 410 and the alternator 114, current will flow through resistors 440 and 442. Resistor 442, in the preferred embodiment, is a 1 ohm resistor and acts as a shunt for the meter 404. Meter 404 senses the voltage drop across resistor 442 and displays that drop in millivolts. Because resistor 442 is a 1 ohm resistor, the display of the millivolt drop across resistor 442 is also a reading of the milliamp reverse current leakage between the battery 408 and the alternator 114.

Most alternators have a 100 milliamp limit for reverse current leakage. Therefore, as long as the current leakage shown in display 304 is less than 100 milliamps, the alternator 114 is functioning within the manufacturer's limit. If the reverse current leakage is greater than 100 milliamps, the alternator 114 is defective and needs to be replaced. If the reading is more than 100 milliamps, the operator may check to make sure that the electrical hookup of the alternator to the testing device does not create a condition of reverse polarity. In a case of reverse polarity, the reading would be over 100 milliamps (also resulting in a blinking overscale condition of the display 304 of the meter 404) irrespective of whether the alternator was functioning properly or not. A diode 448 is connected between batteries 408, 410 and the alternator 114 to isolate the alternator and test leads from accidental shorts or reverse polarity.

If the alternator passes the reverse current leakage test, the operator may then move on to test the voltage output of the alternator. Voltage output tests whether the alternator will recharge a motor vehicle battery adequately. Once again, because the alternator is being tested under actual operating conditions, this test is more accurate than tests conducted using devices which only simulate operation.

Switch 318 is moved to the VOLTS position, if it is not already there. The operator may recheck belt 210 tension, alignment and proper hookup. Switch 320 is then turned to the ON position and the voltage reading at display 304 is noted. In a 12 volt alternator, a reading of 13.8 volts to 14.8 volts is acceptable. For a 24 volt unit, a reading of 27.6 volts to 29.6 volts is acceptable.

When the charging voltage of the alternator is being tested, circuit 400 is measuring the voltage across the alternator 114 via the voltage divider 428. The voltage divider is set up so that the voltage drop across resistors 428A and 428B is actually in millivolts. In the preferred embodiment, resistor 428A is a 1000 ohm variable resistor, resistor 428B is a 9800 ohm resistor, and resistor 428C is a 1000 k ohm resistor. Thus, the voltage reading across resistors 428A and 428B is the voltage across the alternator 114 in millivolts instead of volts. The number displayed as the voltage from meter 404 is in millivolts, but is the same as the number of volts generated by alternator 114.

With switch 318 set to VOLTS, the display 304 of the meter 404 will show the voltage available from batteries 408, 410. When switch 312 is set to 12 V, the display will show the available voltage at batteries 408, 410 in parallel. In the preferred embodiment, this reading will be approximately 13 volts. When switch 312 is set to 24 V, the display will show the available voltage at batteries 408, 410 in series. Again, in the preferred embodiment, this reading will be approximately 26 volts.

Once switch 318 is set to VOLTS, the motor 430 is activated by turning switch 320 to its ON position. As motor 430 gets up to speed and drives the alternator 114, the voltage shown on display 304 will be the voltage generated by the alternator 114. This voltage is the same as the voltage the alternator would generate in a motor vehicle during operation. The motor 430 is a hybrid motor that drives the alternator which in turn tries to charge the batteries 408, 410.

The structure of motor 430 is a matter of design choice. In the preferred embodiment, motor 430 has been constructed so that it will draw current as needed to minimize the current output of the alternator.

Since the batteries 408, 410 are fully charged (due to the constant charging by power supply 406 during nonuse periods), the alternator 114 would normally produce very little current. However, an even load is placed on the batteries 408, 410 from operation of the motor 430. Therefore, the alternator 114 senses a load and that the batteries need to be charged.

The load of the motor 430 is variable. The size of an alternator can range from units that are rated at 45 A to units which are rated at 200 A. The present invention is capable of testing any alternators in that range. An additional load may be added to test units above the amperage load of the motor 430. An extremely large variable resistor 424 and a fixed resistor 454 are available to provide that additional load back to the batteries. In the preferred embodiment, resistor 424 is rated at not less than 200 A in order to accommodate the full range of alternator current outputs. Resistor 424 can be adjusted, as will be described in more detail below, using the AMPS OUTPUT CONTROL dial 324 on panel 300.

With the motor 430 still running, amperage output is then tested by turning switch 318 from VOLTS to AMPS. Switching from VOLTS to AMPS changes the place where the meter 404 is sensing. On the VOLTS setting, meter 404 measures the voltage drop across the voltage divider 428. When switch 318 is turned to the AMPS setting, the meter 404 then measures across shunt 426 to measure the current output of the alternator 114. The AMPS OUTPUT CONTROL dial 324 is then rotated until output shown in display 304 reaches a maximum value. If the amperage displayed is within ten percent of the amperage rating on the nameplate of the alternator, then the alternator is functioning properly.

Throughout testing of the alternator, as described above, an LED circuit 450 tests for erratic output ripples in the current generated by the alternator 114. Such ripples typically are caused by a diode-stator imbalance in the alternator. If light 350 lights up brightly during testing, the operator knows that there is a diode-stator imbalance and that the alternator is bad.

Variations, modifications and other applications will become apparent to those presently of ordinary skill in the art. For example, the present invention may be adapted for use in testing other electrical generating equipment. Additionally, the components used in the testing circuit may be varied to achieve other obvious results. Therefore, the above description of the preferred embodiment is to be interpreted as illustrative rather than limiting. The scope of the present invention is limited only by the scope of the claims which follow.

What is claimed is:

1. A device capable of testing a variety of motor vehicle alternators for testing a single alternator under conditions identical to conditions encountered in a motor vehicle when the alternator is in use in the motor vehicle, said device comprising:

(a) a frame;

(b) an alternator mounting bracket attached to said frame; and (c) an operator-controlled circuit proximate said alternator mounting bracket for selective alternator testing, said testing circuit comprising:

(1) a power supply;

(2) a motor;

(3) a first subcircuit for directly measuring and displaying any alternator reverse current leakage;

(4) a second subcircuit for measuring and displaying alternator charging voltage output;

(5) a third subcircuit for measuring and displaying maximum alternator current output;

(6) a fourth subcircuit for detecting and indicating alternator diode and stator imbalance; and (7) an operator-controlled switch array for selecting which of said subcircuits is in use.

2. The device of claim 1 wherein said alternator mounting bracket comprises:

(a) an L-shaped brace;

(b) first and second mounting pins slidable on said brace;

(c) a belt;

(d) a belt guard; and (e) means for selectively increasing and decreasing tension of said belt when it is operatively connected to said alternator.

3. The device of claim 1 wherein said operator-controlled circuit for selective alternator testing includes a voltage selection switch for configuring said device to test an alternator rated at a preselected voltage output.

4. The device of claim 1 wherein said power supply includes a battery unit.

5. The device of claim 4 wherein said battery unit comprises a plurality of batteries and means for recharging said batteries using standard household electrical service.

6. The device of claim 1 wherein said operator-controlled switch array comprises:
(a) a first switch permitting the operator to select a preselected alternator voltage rating;
(b) a second switch permitting the operator to turn on said operator-controlled circuit for selective alternator testing;
(c) a third switch permitting the operator to selectively perform alternator remagnetization and alternator reverse current leakage measurement and display;
(d) a fourth switch permitting the operator to test alternator charging voltage output and alternator maximum current output; and
(e) a fifth switch permitting the operator to turn said motor on and off.

7. The device of claim 1 wherein said device is capable of testing alternators rated at 12 volts and 24 volts.

8. The device of claim 1 wherein said device is capable of testing alternators rated in the range of approximately 45 amps to 200 amps.

9. A device capable of testing a variety of motor vehicle alternators for testing a single alternator under conditions identical to conditions encountered in a motor vehicle when the alternator is in use in the motor vehicle, said device comprising:
(a) a frame;
(b) an alternator mounting bracket attached to said frame; and
(c) an operator-controlled testing circuit proximate said alternator mounting bracket for selective alternator testing, said testing circuit comprising:
(1) a power supply;
(2) a motor;
(3) a first unit for directly measuring and displaying any alternator reverse current leakage;
(4) a second unit for measuring and displaying alternator charging voltage output;
(5) a third unit for measuring and displaying maximum alternator current output; and
(6) a fourth unit for detecting and indicating alternator diode and stator imbalance;
(7) an operator-controlled switch array for selecting which of said units is in use.

10. The device of claim 9 wherein said power supply comprises a plurality of batteries and an operator-controlled battery recharging circuit using standard household electrical service.

11. The device of claim 10 wherein said device further comprises an alternator remagnetization circuit.

12. The device of claim 11 wherein said device further comprises an alternator remagnetization circuit.

13. The device of claim 12 wherein said device further comprises an operator-controlled switch for configuring said device for alternator testing at a preselected voltage rating.

14. The device of claim 13 wherein said device is capable of selectively testing alternators in the range of 45 amps to 200 amps and further is capable of selectively testing alternators rated 12 volts and 24 volts.

15. A device capable of testing a variety of motor vehicle alternators for testing a single alternator under conditions identical to conditions encountered in a motor vehicle when the alternator is in use in the motor vehicle, said device comprising:
(a) a frame;
(b) an alternator mounting bracket attached to said frame, wherein said alternator mounting bracket comprises:
(1) an L-shaped brace;
(2) first and second mounting pins slidable on said brace;
(3) a belt;
(4) a belt guard; and
(5) means for selectively increasing and decreasing tension of said belt when it is operatively connected to said alternator; and
(c) an operator-controlled circuit proximate said alternator mounting bracket for selective alternator testing, said testing circuit comprising:
(1) a power supply comprising a plurality of batteries and means for recharging said batteries using standard household electrical service;
(2) a voltage selection switch for configuring said device to test an alternator rated at a preselected voltage output;
(3) a motor;
(4) a first subcircuit for directly measuring and displaying any alternator reverse current leakage;
(5) a second subcircuit for measuring and displaying alternator charging voltage output;
(6) a third subcircuit for measuring and displaying maximum alternator current output;
(7) a fourth subcircuit for detecting and indicating alternator diode and stator imbalance; and
(8) an operator-controlled switch array for selecting which of said subcircuits is in use
(9) a first switch permitting the operator to select a preselected alternator voltage rating;
(10) a second switch permitting the operator to turn on said operator-controlled circuit for selective alternator testing;
(11) a third switch permitting the operator to selectively perform alternator remagnetization and alternator reverse current leakage measurement and display;
(12) a fourth switch permitting the operator to test alternator charging voltage output and alternator maximum current output; and
(13) a fifth switch permitting the operator to turn said motor on and off.

16. The device of claim 15 wherein said device is capable of testing alternators rated at 12 volts and 24 volts.

17. The device of claim 15 wherein said device is capable of testing alternators rated in the range of approximately 45 amps to 200 amps.

* * * * *